(12) United States Patent
Kutsukake

(10) Patent No.: US 11,670,631 B2
(45) Date of Patent: Jun. 6, 2023

(54) SEMICONDUCTOR DEVICE

(71) Applicant: Kioxia Corporation, Tokyo (JP)

(72) Inventor: Hiroyuki Kutsukake, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 291 days.

(21) Appl. No.: 17/189,744

(22) Filed: Mar. 2, 2021

(65) Prior Publication Data
US 2022/0077135 A1 Mar. 10, 2022

(30) Foreign Application Priority Data
Sep. 10, 2020 (JP) .............................. JP2020-151885

(51) Int. Cl.
*H01L 27/088* (2006.01)
*H01L 27/02* (2006.01)

(52) U.S. Cl.
CPC ........ *H01L 27/0207* (2013.01); *H01L 27/088* (2013.01)

(58) Field of Classification Search
CPC .......................... H01L 27/0207; H01L 27/088
See application file for complete search history.

(56) References Cited

U.S. PATENT DOCUMENTS

| 7,583,533 | B2 * | 9/2009 | Kutsukake ......... G11C 16/0483 365/185.05 |
| 8,059,469 | B2 * | 11/2011 | Lee ................... H01L 27/11573 365/185.23 |
| 8,400,812 | B2 * | 3/2013 | Kutsukake ........ H01L 27/11529 365/185.11 |
| 2010/0008152 | A1 * | 1/2010 | Lee .......................... H01L 29/78 365/185.23 |
| 2012/0236619 | A1 * | 9/2012 | Kutsukake ............ H01L 27/088 365/72 |
| 2018/0182844 | A1 | 6/2018 | Nakamura |
| 2019/0057754 | A1 | 2/2019 | Huang et al. |

FOREIGN PATENT DOCUMENTS

| CN | 101626021 A | 1/2010 |
| CN | 108242464 A | 7/2018 |
| CN | 109411444 A | 3/2019 |

* cited by examiner

*Primary Examiner* — Mounir S Amer
*Assistant Examiner* — Alexander Belousov
(74) *Attorney, Agent, or Firm* — Foley & Lardner LLP

(57) ABSTRACT

A semiconductor device includes first, second, third, and fourth active regions provided in an substrate, each of which includes a central portion, first and second portions provided at opposite sides of the central portion in a first direction, and third and fourth portions provided at opposite sides of the central portion in a second direction orthogonal to the first direction. An end portion of the first portion of the first active region faces a side portion of the fourth portion of the fourth active region, an end portion of which faces aside portion of the second portion of the second active region. An end portion of the second portion of the second active region faces a side portion of the third portion of the third active region, an end portion of which faces a side portion of the first portion of the first active region.

15 Claims, 9 Drawing Sheets

SEMICONDUCTOR DEVICE

CROSS-REFERENCE TO RELATED APPLICATION

This application is based upon and claims the benefit of priority from Japanese Patent Application No. 2020-151885, filed Sep. 10, 2020, the entire contents of which are incorporated herein by reference.

FIELD

Embodiments described herein relate generally to a semiconductor device.

BACKGROUND

When a plurality of active regions are formed in a substrate, a density of the active regions on the front surface of the substrate may become low depending on a planar shape of the active regions. In order to improve the degree of integration of the semiconductor device, it is desirable that these active regions are arranged at a high density in the substrate.

DETAILED DESCRIPTION

Figure 1:
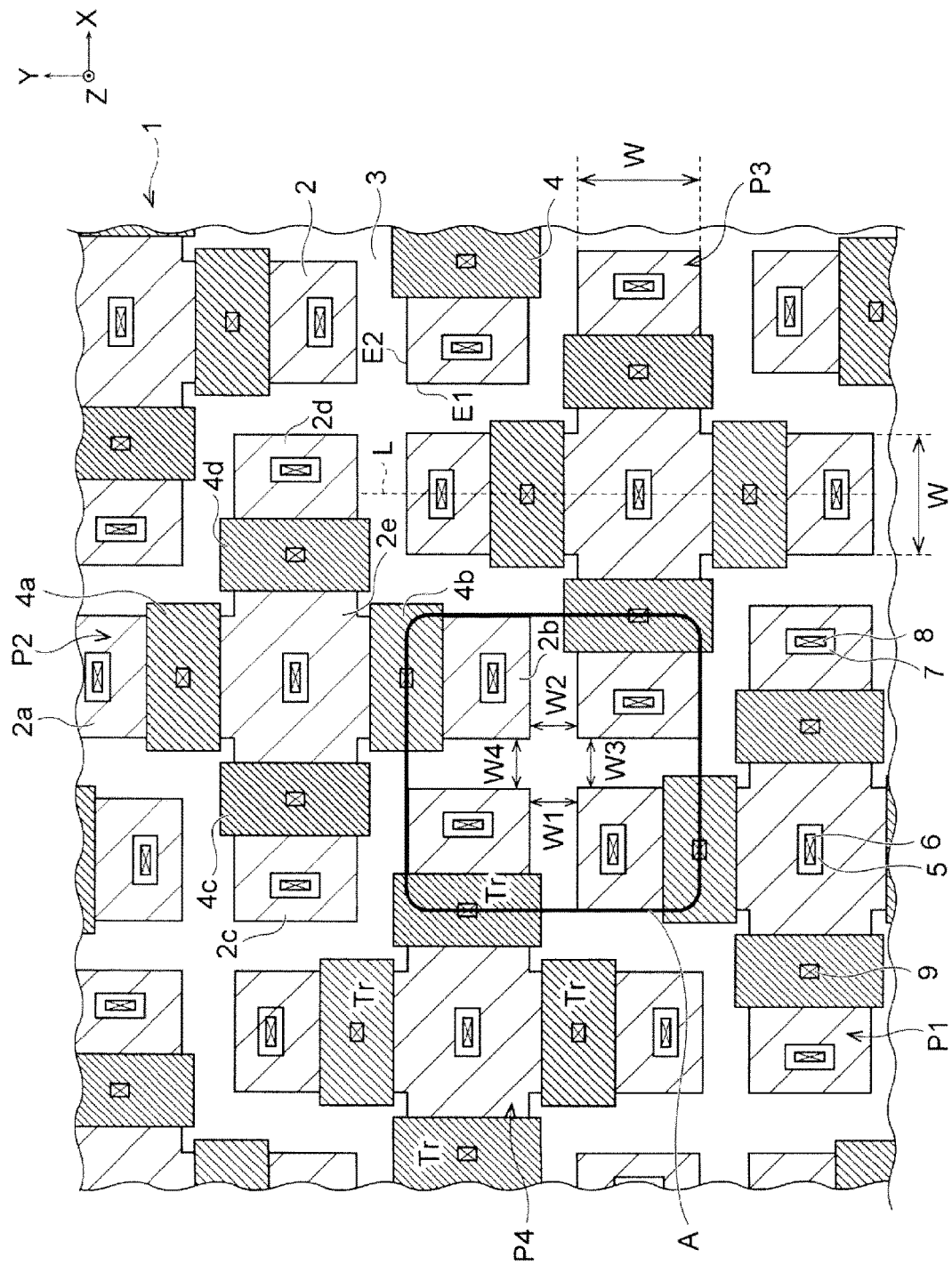
FIG. 1 is a plan view illustrating a structure of a semiconductor device in a first embodiment.

Embodiments provide a semiconductor device on which a plurality of active regions can be arranged in a substrate at a high density.

In general, according to one embodiment, a semiconductor device includes: a substrate; a plurality of active regions provided in the substrate; and an element isolation area provided in the substrate. Furthermore, each of first, second, third, and fourth active regions of the plurality of active regions include a central portion, a first portion provided in first direction of the central portion, a second portion provided in a first direction of the central portion and at a side opposite to the first portion, a third portion provided in a second direction of the central portion that is orthogonal to the first direction, and a fourth portion provided at an opposite side of the third portion in the second direction of the central portion. Furthermore, an end portion of the first portion of the first active region faces a side portion of the fourth portion of the fourth active region, an end portion of the second portion of the second active region faces a side portion of the third portion of the third active region, an end portion of the third portion of the third active region faces a side portion of the first portion of the first active region, and an end portion of the fourth portion of the fourth active region faces a side portion of the second portion of the second active region.

Hereinafter, embodiments of the present disclosure will be described with reference to the drawings. In FIG. 1 to FIG. 9, the same configurations are designated by the same reference numerals, and the descriptions thereof will not be repeated.

First Embodiment

FIG. 1 is a plan view illustrating a structure of a semiconductor device in a first embodiment.

The semiconductor device in the present embodiment is, for example, a three-dimensional memory, and includes a memory cell array and a peripheral circuit unit. The memory cell array includes a cell transistor (memory cell) and a select transistor. The peripheral circuit unit includes peripheral transistors that control the operation of the memory cell array, such as LV (low voltage) transistors having a thin gate insulating film and HV (high voltage) transistors having a thick gate insulating film. FIG. 1 illustrates the peripheral circuit unit, and specifically, illustrates a plurality of peripheral transistors (for example, HV transistors) Tr in the peripheral circuit unit. These transistors Tr are examples of control transistors.

As illustrated in FIG. 1, the semiconductor device in the present embodiment includes a substrate 1, a plurality of active regions 2, an element isolation area 3, a plurality of gate electrodes 4, a plurality of diffusion regions 5, a plurality of contact plugs 6, a plurality of diffusion regions 7, a plurality of contact plugs 8, and a plurality of contact plugs 9. The diffusion region 5 is an example of a first diffusion region, and the contact plug 6 is an example of a first plug. The diffusion region 7 is an example of a second diffusion region, and the contact plug 8 is an example of a second plug. The contact plug 9 is an example of a third plug.

The substrate 1 is, for example, a semiconductor substrate such as a silicon (Si) substrate. FIG. 1 illustrates the X and Y directions parallel to the front surface (upper surface) of the substrate 1 and orthogonal to each other, and the Z direction orthogonal to the front surface (upper surface) of the substrate 1. In the present specification, the +Z direction is treated as an upward direction, and the −Z direction is treated as a downward direction. The −Z direction may or may not be coincident with the direction of gravity. The ±Y direction is an example of a first direction, and the ±X direction is an example of a second direction.

The planar shape of the upper surface of the substrate 1 is, for example, a square or a rectangle having two sides parallel to the X direction and two sides parallel to the Y direction. The two sides parallel to the Y direction are examples of a first side. The two sides parallel to the X direction are examples of a second side. FIG. 1 illustrates a part of the upper surface of the substrate 1. The shape of the substrate 1 is, for example, a rectangular parallelepiped having an upper surface, a lower surface, and four side surfaces (end surfaces).

The plurality of active regions 2 described above are provided in the substrate 1 as a part of the substrate 1. Accordingly, these active regions 2 are formed of, for example, a semiconductor substrate such as a silicon substrate. These active regions 2 are also referred to as AA (active area).

Each active region 2 includes a protruding portion 2a, a protruding portion 2b, a protruding portion 2c, a protruding portion 2d, and a central portion 2e. The protruding portions 2a, 2b, 2c, and 2d are provided in the +Y direction, the −Y direction, the −X direction, and the +X direction of the central portion 2e, respectively, and protrudes from the central portion 2e in these directions. Therefore, the planar shape of each active region 2 in the present embodiment is a cross shape in which protruding portions 2a, 2b, 2c, and 2d are provided around the central portion 2e. The protruding portion 2b is positioned on the opposite side of the protruding portion 2a with respect to the central portion 2e, and the protruding portion 2d is positioned on the opposite side of the protruding portion 2c with respect to the central portion 2e. The protruding portions 2a, 2b, 2c, and 2d are examples of a first, a second, a third, and a fourth portion, respectively.

Each planar shape of the protruding portions 2a to 2d and the central portion 2e is, for example, a square or a rectangle. Each of the protruding portion 2a to 2d includes one end portion E1 which is a side (surface) opposite to the central portion 2e, and two side portions E2 which are sides (surfaces) connecting the central portion 2e and the end portion E1. For example, in the protruding portion 2c, the side in the −X direction is the end portion E1, and the side in the ±Y direction is the side portion E2. The planar shape of each active region 2 may be a shape other than the cross shape, and the planar shape of each of the protruding portions 2a to 2d and the central portion 2e may be shapes other than the squares and rectangles.

The element isolation area 3 is provided in the substrate 1 and is formed of an element isolation insulating film embedded in a device isolation groove of the substrate 1. This element isolation insulating film is, for example, a silicon insulating film. The element isolation area 3 in the present embodiment has a shape surrounding each active region 2. As a result, the planar shape of each active region 2 becomes a cross shape as illustrated in FIG. 1. The element isolation insulating film 3 is also called a shallow trench isolation (STI) region.

The plurality of gate electrodes 4 are formed on the protruding portions 2a to 2d of each active region 2 via the gate insulating film. As a result, four peripheral transistors Tr are provided on each active region 2. The peripheral transistors Tr on the protruding portions 2a to 2d are examples of the first to fourth transistors, respectively. The plurality of gate electrodes 4 include a gate electrode 4a on the protruding portion 2a, a gate electrode 4b on the protruding portion 2b, a gate electrode 4c on the protruding portion 2c, and a gate electrode 4d on the protruding portion 2d. Each contact plug 9 is formed on the corresponding gate electrode 4.

Each diffusion region 5 is formed in the central portion 2e of each active region 2 and contains a p-type impurity or an n-type impurity in high concentration. The planar shape of diffusion region 5 in the present embodiment is, for example, a rectangle or a shape similar to a rectangle. Each contact plug 6 is formed on the corresponding diffusion region 5.

Each diffusion region 7 is formed in any of the protruding portions 2a to 2d of each active region 2, and contains the p-type impurity or the n-type impurity in high concentration. Therefore, each active region 2 includes four diffusion regions 7 in the protruding portions 2a to 2d. The planar shape of the diffusion region 7 in the present embodiment is, for example, a rectangle or a shape similar to a rectangle. Each contact plug 8 is formed on the corresponding diffusion region 7.

The active regions 2 in the present embodiment have the same shape. In addition, these active regions 2 are periodically arranged in the X direction and the Y direction in the substrate 1. In addition, the arrangement of the gate electrode 4 in these active regions 2 and the arrangement of the diffusion regions 5 and 7 in these active regions 2 are also the same between the active regions 2. However, in the present embodiment, the active regions 2 may have the shapes different from each other, and the arrangements of the gate electrode 4 and the diffusion regions 5 and 7 may be different between the active regions 2. Furthermore, these active regions 2 may be arranged non-periodically.

Figure 2:
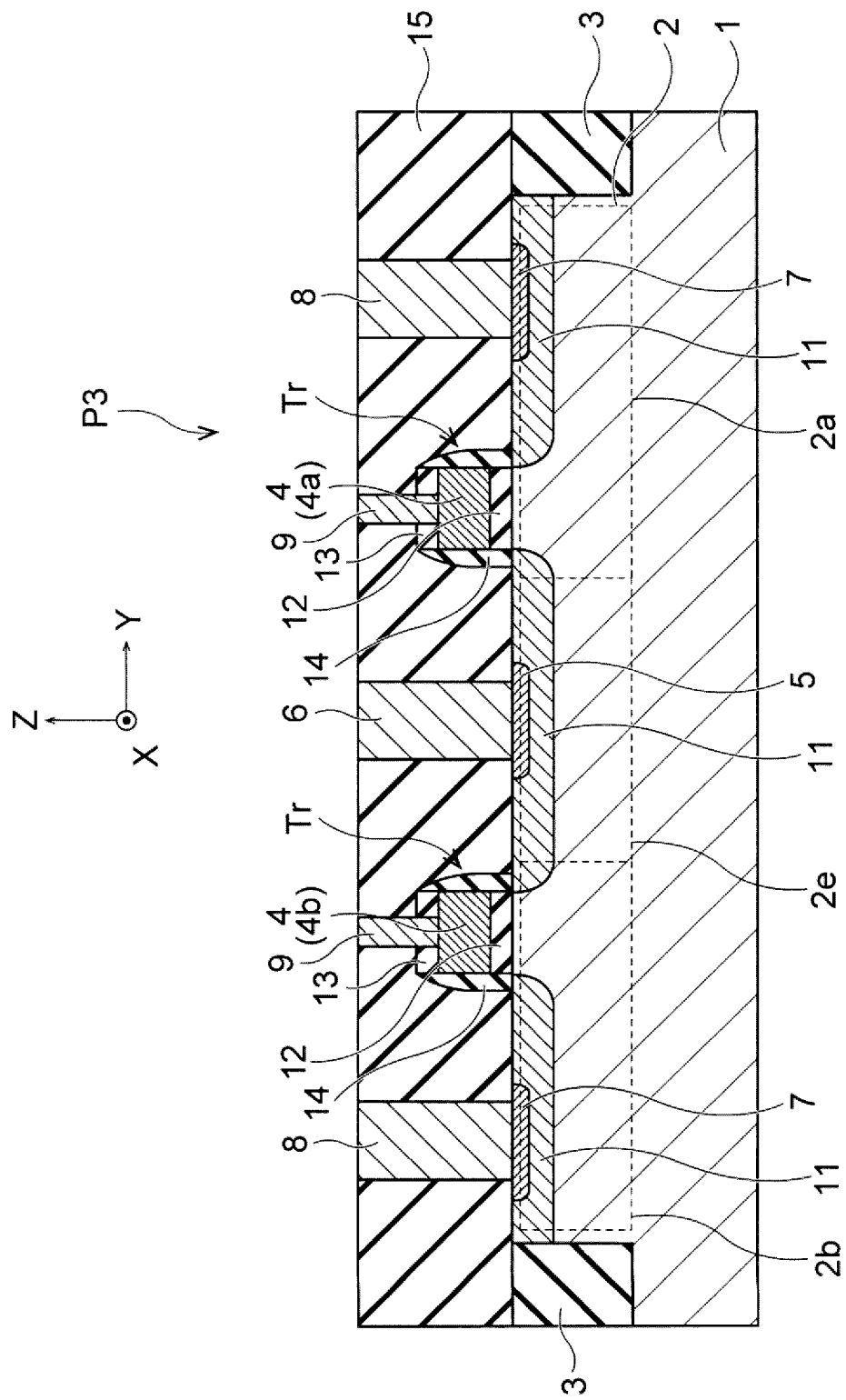
FIG. 2 is a cross-sectional view illustrating the structure of the semiconductor device in the first embodiment.

FIG. 2 is a cross-sectional view illustrating a structure of the semiconductor device in the first embodiment.

FIG. 2 is a cross-sectional view along a straight line L illustrated in FIG. 1. In addition to the above-described elements, the semiconductor device in the present embodiment includes a plurality of source/drain regions 11, a plurality of gate insulating films 12, a plurality of cap insulating films 13, a plurality of side wall insulating films 14, and an interlayer insulating film 15.

FIG. 2 illustrates positions of one active region 2 and positions in the protruding portion 2a, the protruding portion 2b, and the central portion 2e of the active region 2 with dashed lines. Each active region 2 in the present embodiment includes a plurality of source/drain regions 11 as illustrated in FIG. 1. Specifically, each active region 2 in the present embodiment includes the protruding portions 2a to 2d and five source/drain regions 11 in the central portion 2e, and includes one diffusion region 5 or one diffusion region 7 in each source/drain region 11. These source/drain regions 11 contains the p-type impurity or the n-type impurity. In the present embodiment, the active region 2 is, for example, the p-type impurity region, and the diffusion region 5, the diffusion region 7, and the source/drain region 11 are, for example, the n-type impurity region.

Each peripheral transistor Tr includes the gate insulating film 12, the gate electrode 4, and the cap insulating film 13 in this order on any one of the protruding portions 2a to 2d, and includes a side wall insulating film 14 on the side surface of the gate insulating film 12, the gate electrode 4, and the cap insulating film 13. The gate insulating film 12, the gate electrode 4, and the cap insulating film 13 are interposed between the two source/drain regions 11. The gate insulating film 12 is, for example, a silicon oxide film or a high-k insulating film. The gate electrode 4 is, for example, a polysilicon layer or a metal layer. The cap insulating film 13 is, for example, a silicon oxide film or a silicon nitride film. The side wall insulating film 14 is, for example, a stack film including a silicon oxide film and a silicon nitride film. FIG. 2 illustrates the gate electrode 4a on the protruding portion 2a and the gate electrode 4b on the protruding portion 2b. On each of the peripheral transistors Tr, the contact plug 9 is formed on the gate electrode 4 through the cap insulating film 14.

The interlayer insulating film 15 is formed on the substrate 1, and specifically, is formed on each active region 2 or element isolation insulating film 3 so as to cover each peripheral transistor Tr. The contact plugs 6 and 8 are formed on the diffusion regions 5 and 7 in the interlayer insulating film 15. The interlayer insulating film 15 is, for example, a silicon oxide film.

Next, further details of the structure of the semiconductor device in the present embodiment will be described with reference to FIG. 1 again.

In the semiconductor device in the present embodiment, four active regions 2 adjacent to each other form one block. For example, the four active regions 2 represented by signs P1, P2, P3, and P4 form one block A. In the following description, the active regions 2 represented by the signs P1, P2, P3, and P4 are referred to as active regions P1, P2, P3, and P4, respectively. The active regions P1, P2, P3, and P4 are examples of a first, second, third, and fourth active region, respectively. Hereinafter, details of each block in the present embodiment will be described with the block A as an example. The following description of the block A is also applied to other blocks in the present embodiment.

The block A is formed by the protruding portion 2a of the active region P1, the protruding portion 2b of the active region P2, the protruding portion 2c of the active region P3, and the protruding portion 2d of the active region P4. In the block A, the end portion E1 of the protruding portion 2a of the active region P1 faces the side portion E2 of the protruding portion 2d of the active region P4. In addition, the end portion E1 of the protruding portion 2b of the active region P2 faces the side portion E2 of the protruding portion 2c of the active region P3. In addition, the end portion E1 of the protruding portion 2c of the active region P3 faces the side portion E2 of the protruding portion 2a of the active region P1. In addition, the end portion E1 of the protruding portion 2d of the active region P4 faces the side portion E2 of the protruding portion 2b of the active region P2.

FIG. 1 illustrates a distance W1 between the protruding portion 2a of the active region P1 and the protruding portion 2d of the active region P4, a distance W2 between the protruding portion 2b of the active region P2 and the protruding portion 2c of the active region P3, a distance W3 between the protruding portion 2c of the active region P3 and the protruding portion 2a of the active region P1, and a distance W4 between the protruding portion 2d in the active region P4 and the protruding portion 2b in the active region P2. The distances W1, W2, W3, and W4 are examples of a first, second, third, and fourth distance, respectively. In the present embodiment, the distances W1, W2, W3, and W4 are equal to each other (W1=W2=W3=W4).

FIG. 1 further illustrates a width W of the protruding portions 2a to 2d. The width W represents widths of the protruding portions 2a and 2b in the X direction and widths of the protruding portion 2c and 2d in the Y direction. The protruding portions 2a, 2b, 2c, and 2d in the present embodiment have the same width W. In the present embodiment, the distances W1, W2, W3, and W4 are shorter than the width W (W1, W2, W3, W4<W) respectively. Therefore, in the block A in the present embodiment, the protruding portion 2a of the active region P1, the protruding portion 2b of the active region P2, the protruding portion 2c of the active region P3, and the protruding portion 2d of the active region P4 are densely arranged.

The distances W1 to W4 do not have to be equal to each other. In addition, the protruding portions 2a to 2d do not have to have the same width. In addition, the distances W1 to W4 do not have to be shorter than the width W. However, in order to preferably arrange a plurality of active regions 2 in the substrate 1, the distances W1 to W4 are preferably equal to each other, the widths of the protruding portions 2a to 2d are preferably the same, and the distances W1 to W4 are preferably shorter than width W.

Figure 3:
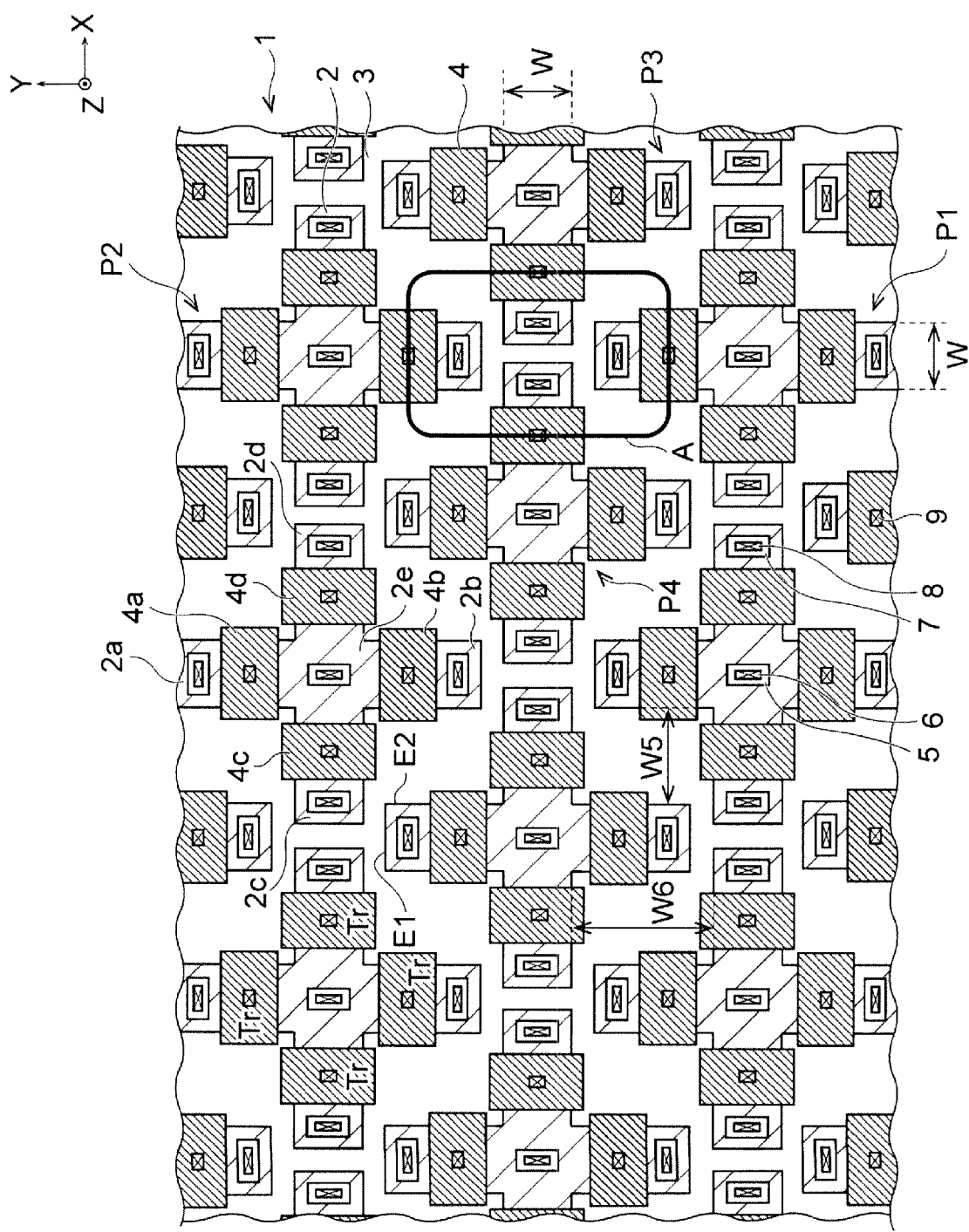
FIG. 3 is a plan view illustrating a structure of a semiconductor device in a comparative example in the first embodiment.

FIG. 3 is a plan view illustrating a structure of a semiconductor device in a comparison example of the first embodiment.

Similarly to the semiconductor device in the present embodiment, the semiconductor device in the comparison example includes a substrate 1, a plurality of active regions 2, an element isolation area 3, a plurality of gate electrodes 4, a plurality of diffusion regions 5, a plurality of contact plugs 6, and a plurality of diffusion regions 7, a plurality of contact plugs 8, and a plurality of contact plugs 9. Similarly to FIG. 1, FIG. 3 illustrates the active regions P1, P2, P3, and P4 and a block A. FIG. 3 further illustrates a distance W5 between the protruding portion 2a and the protruding portion 2b of the active regions 2 adjacent to each other, and a distance W6 between the protruding portion 2c and the protruding portion 2d of the active regions 2 adjacent to each other.

In the block A in the present comparison example, the end portion E1 of the protruding portion 2a of the active region P1 faces the side portion E2 of the protruding portion 2c of the active region P3, and faces the side portion E2 of the protruding portion 2d of the active region P4. In addition, the end portion E1 of the protruding portion 2b of the active region P2 faces the side portion E2 of the protruding portion 2c of the active region P3, and faces the side portion E2 of the protruding portion 2d of the active region P4. In addition, the end portion E1 of the protruding portion 2c of the active region P3 faces the end portion E1 of the protruding portion 2d of the active region P4.

In the present comparison example, since the active regions 2 are arranged in a layout described above, the distance W5 between the protruding portions 2a and 2b of the active regions 2 adjacent to each other becomes long, and thus, a large space is created between these protruding portions 2a and 2b. Furthermore, the distance W6 between the protruding portions 2c and 2d of the active regions 2 adjacent to each other becomes long, and a large space is generated between these protruding portions 2c and 2d. In the block A in the present comparison example, the protruding portion 2a of the active region P1, the protruding portion 2b of the active region P2, the protruding portion 2c of the active region P3, and the protruding portion 2d of the active region P4 are not densely arranged compared to those in the block A in the present embodiment.

Figure 4A:
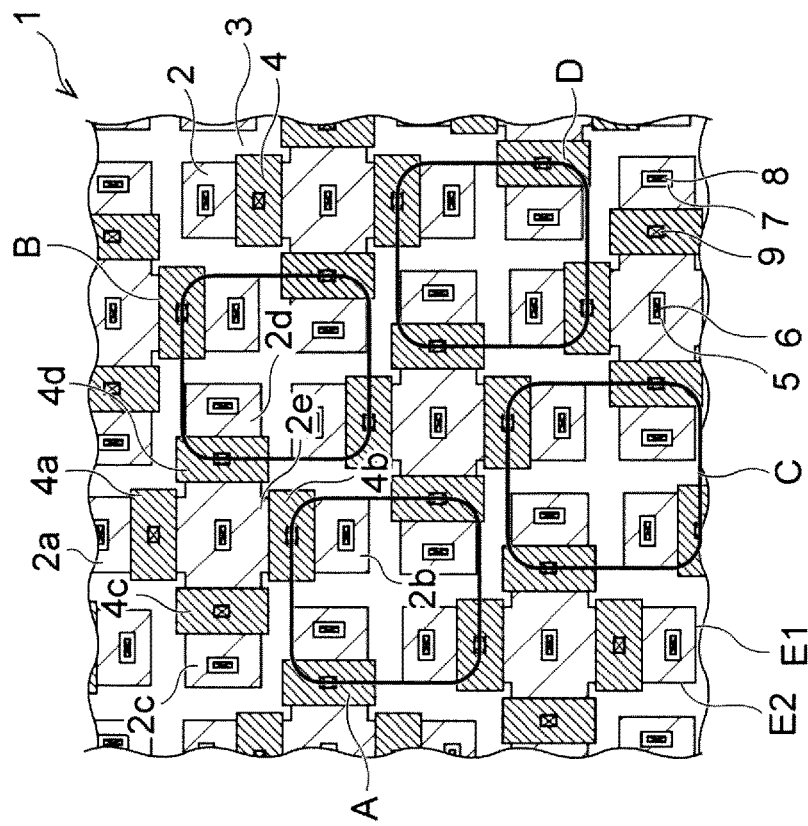
FIG. 4A and FIG. 4B are plan views for comparing the semiconductor device in the comparison example and the semiconductor device in the first embodiment.
Figure 4B:
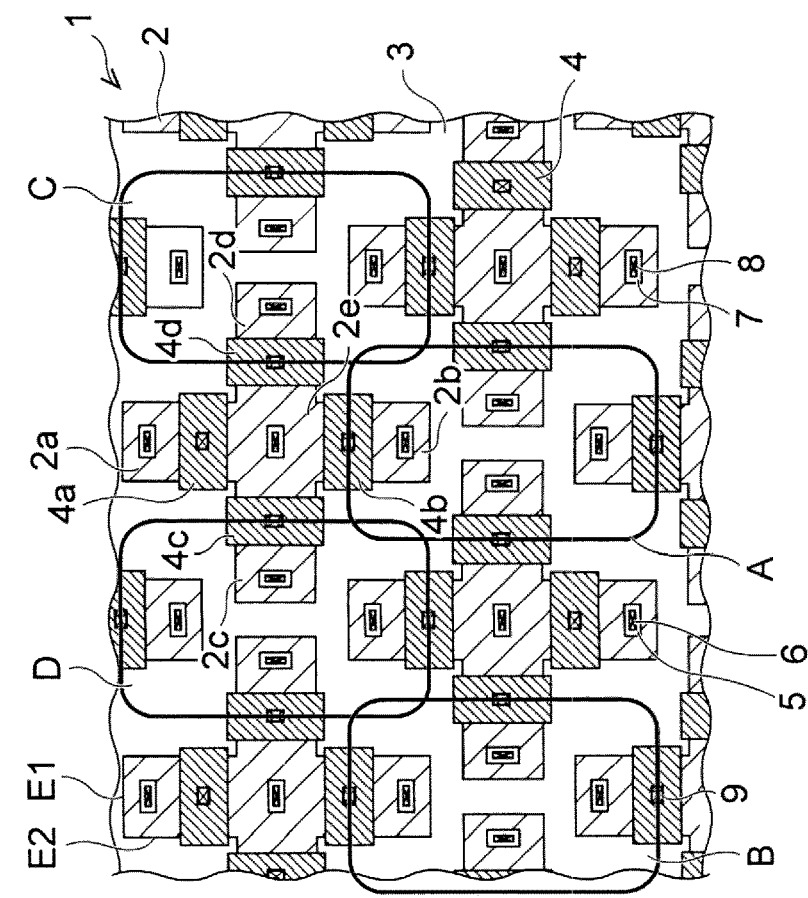

FIG. 4A and FIG. 4B are plan views for comparing the semiconductor device in the comparison example and the semiconductor device in the first embodiment described above.

Similarly to FIG. 3, FIG. 4A illustrates the semiconductor device in the comparison example. FIG. 4A illustrates a block A, a block B, a block C, and a block D as the blocks of four active regions 2 adjacent to each other. In the present comparison example, the peripheral transistor Tr operates for each block. The semiconductor device in the comparison example includes a plurality of blocks A, a plurality of blocks B, a plurality of blocks C, and a plurality of blocks D, and FIG. 4A illustrates one block A, one block B, one block C, and one block D as a part of these blocks A to D.

Similarly to FIG. 1, FIG. 4B illustrates the semiconductor device in the present embodiment. Similarly to FIG. 4A, FIG. 4B illustrates a block A, a block B, a block C, and a block D as blocks of four active regions 2 adjacent to each other. In the present embodiment also, the peripheral transistor Tr operates for each block. The semiconductor device in the present embodiment includes a plurality of blocks A, a plurality of blocks B, a plurality of blocks C, and a plurality of blocks D, and FIG. 4B illustrates one block A, one block B, one block C, and one block D as a part of these blocks A to D.

In each block in the present comparison example, the protruding portion 2b is arranged in the +Y direction of the protruding portion 2a, the protruding portion 2d is arranged in the −X direction of the protruding portion 2c. In the present comparison example, by adopting such an arrangement, the density of the active region 2 on the front surface of the substrate 1 becomes low. For example, a large space is generated in the vicinity of the side portion E2 of the protruding portions 2a to 2d of each block (refer to distances W5 and W6 in FIG. 3). If such a large space is present, the degree of integration of the semiconductor device will be decreased.

On the other hand, in each block in the present embodiment, the protruding portion 2b is arranged in the diagonal direction of the protruding portion 2a, and the protruding portion 2d is arranged in the diagonal direction of the protruding portion 2c. Here, the former diagonal direction is a direction inclined by approximately 45 degrees with respect to the +Y direction, and the latter diagonal direction is a direction inclined by approximately 45 degrees with respect to the −X direction. As a result, the end portion E1 of the protruding portion 2a faces the side portion E2 of the protruding portion 2d, the end portion E1 of the protruding portion 2b faces the side portion E2 of the protruding portion 2c, the end portion E1 of the protruding portion 2c faces the side portion E2 of the protruding portion 2a, and the end portion E1 of the protruding portion 2d faces the side portion E2 of the protruding portion 2b. According to the present embodiment, by adopting such an arrangement, it is possible to increase the density of the active region 2 on the front surface of the substrate 1. In this way, it is possible to improve the degree of integration of the semiconductor device.

Hereinafter, various differences between the semiconductor device in the comparison example described above and the semiconductor device in the first embodiment will be described.

In each block in the present comparison example, the distance between the protruding portions 2a and 2c, the distance between the protruding portions 2a and 2d, the distance between the protruding portions 2b and 2c, the distance between the protruding portions 2b and 2d, and the distance between the protruding portions 2c and 2d are shorter than the width W of the active region 2, but the distance between protruding portions 2a and 2b is longer than the width W of the active region 2. On the other hand, in each block in the present embodiment, the distance between the protruding portions 2a and 2c (W3), the distance between the protruding portions 2a and 2d (W1), the distance between the protruding portions 2b and 2c (W2), the distance between the protruding portions 2b and 2d (W4), the distance between the protruding portions 2c and 2d, and the distance between the protruding portions 2a and 2b are shorter than the width W of the active region 2.

In addition, the protruding portions 2c and 2d of each active region 2 in the present comparison example are disposed between the protruding portion 2a and the protruding portion 2b of the other two active regions 2. On the other hand, the protruding portion 2c of each active region 2 in the present embodiment is disposed between the protruding portion 2b and the protruding portion 2d of other two active regions 2, and the protruding portion 2d of each active region 2 in the present embodiment is disposed between the protruding portion 2a and the protruding portion 2c of other two active regions 2.

In addition, the width of the element isolation area 3 in the present comparison example changes depending on the location. For example, the width of the element isolation area 3 in the present comparison example is widened in the vicinity of the side portion E2 of the protruding portions 2a to 2d of each block. On the other hand, the width of the element isolation area 3 in the present embodiment is the width W at any location.

As described above, in each block in the present embodiment, the end portion E1 of the protruding portion 2a faces the side portion E2 of the protruding portion 2d, the end portion E1 of the protruding portion 2b faces the side portion E2 of the protruding portion 2c, the end portion E1 of the protruding portion 2c faces the side portion E2 of the protruding portion 2a, and the end portion E1 of the protruding portion 2d faces the side portion E2 of the protruding portion 2c. Therefore, according to the present embodiment, it is possible to arrange a plurality of active regions 2 in the substrate 1 at a high density. As a result, it is possible to improve the degree of integration of the semiconductor device in the present embodiment.

Second Embodiment

Figure 5:
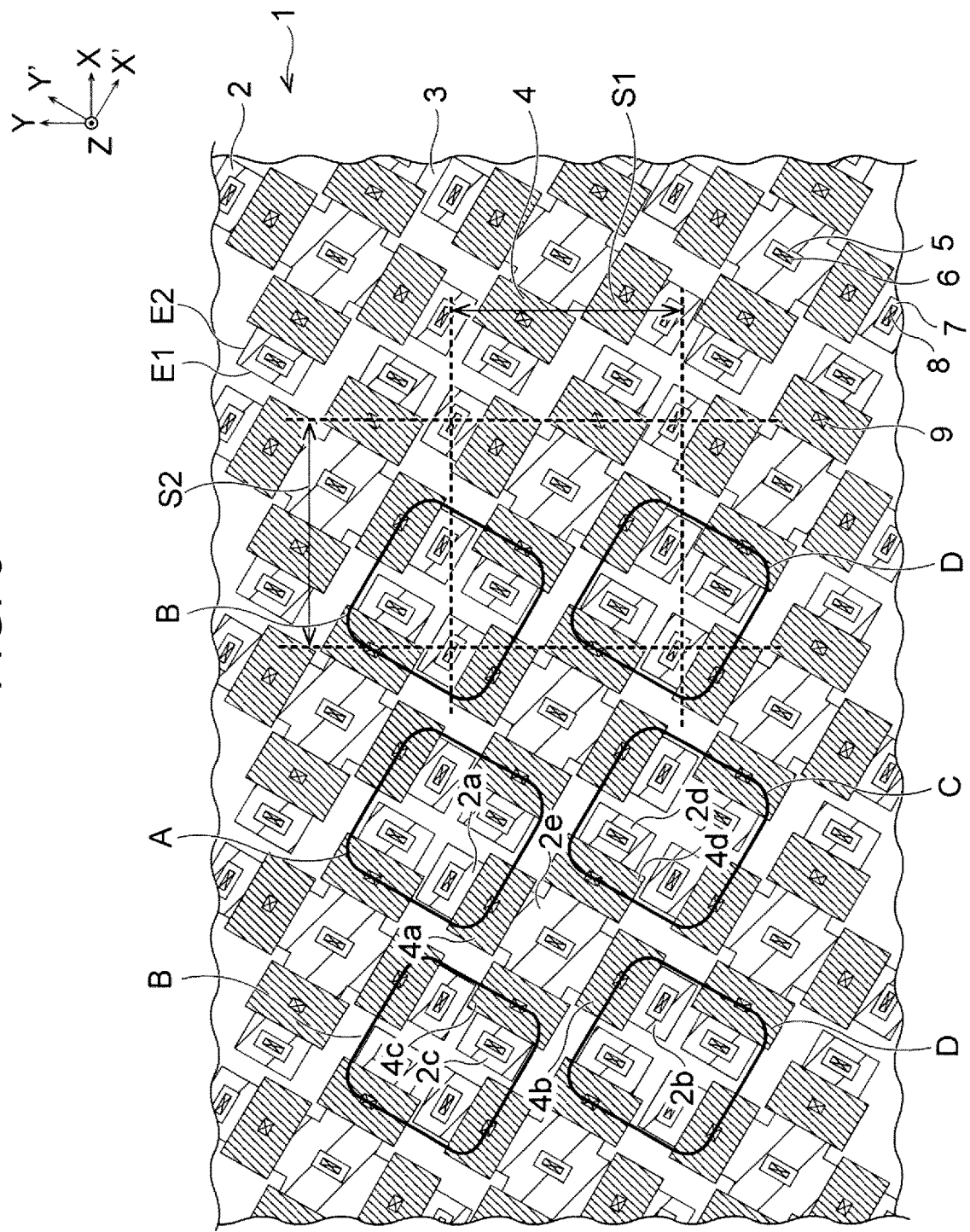
FIG. 5 is a plan view illustrating a structure of a semiconductor device in a second embodiment.

FIG. 5 is a plan view illustrating a structure of a semiconductor device in a second embodiment.

As illustrated in FIG. 5, the semiconductor device in the present embodiment has the elements same as those of the semiconductor device in the first embodiment, and specifically, includes a substrate 1, a plurality of active regions 2, an element isolation area 3, a plurality of gate electrodes 4, a plurality of diffusion regions 5, and a plurality of contact plugs 6, a plurality of diffusion regions 7, a plurality of contact plugs 8, and a plurality of contact plugs 9. FIG. 5 illustrates blocks A, B, C, and D as in FIG. 4B. However, FIG. 5 illustrates one block A, two blocks B, one block C, and two blocks D.

FIG. 5 further shows an X' direction inclined with respect to the X direction and a Y' direction inclined with respect to the Y direction. The X' direction and the Y' direction are parallel to the upper surface of the substrate 1 and orthogonal to each other, similarly to the X and Y directions. The ±Y' direction is an example of a first direction, and the ±X' direction is an example of a second direction.

As described above, the planar shape of the upper surface of the substrate 1 is, for example, a square or a rectangle having two sides parallel to the X direction and two sides parallel to the Y direction. The two sides parallel to the Y direction are examples of a first side. The two sides parallel to the X direction are examples of a second side. FIG. 5 illustrates a part of the upper surface of the substrate 1. The shape of the substrate 1 is, for example, a rectangular parallelepiped having an upper surface, a lower surface, and four side surfaces (end surfaces) as described above.

Each active region 2 in the present embodiment includes protruding portions 2a, 2b, 2c, and 2d and a central portion 2e, similarly to each active region 2 in the first embodiment. However, the protruding portions 2a, 2b, 2c, and 2d in the present embodiment are provided in the +Y' direction, the −Y' direction, the −X' direction, and the +X' direction of the central portion 2e, respectively, and protrudes from the central portion 2e in these directions, respectively. The planar shape of the protruding portions 2a to 2d and the central portion 2e in the present embodiment is, for example, a square or a rectangle having a side parallel to the X' direction and a side parallel to the Y' direction, while the planar shape of the protruding portions 2a to 2d and the central portion 2e in the first embodiment is, for example, a square or a rectangle having a side parallel to the X direction and a side parallel to the Y direction. The planar shape of the active region 2 in the present embodiment is, for example, a cross shape inclined with respect to the four sides of the upper surface of the substrate 1.

In each block in the present embodiment, the end portion E1 of the protruding portion 2a faces the side portion E2 of the protruding portion 2d, the end portion E1 of the protruding portion 2b faces the side portion E2 of the protruding portion 2c, the end portion E1 of the protruding portion 2c faces the side portion E2 of the protruding portion 2a, and the end portion E1 of the protruding portion 2d faces the side portion E2 of the protruding portion 2b. Therefore, according to the present embodiment, it is possible to arrange a plurality of active regions 2 in the substrate 1 at a high density as in the first embodiment. As a result, it is possible to improve the degree of integration of the semiconductor device in the present embodiment.

FIG. 5 further illustrates a pitch S1 in the Y direction and a pitch S2 in the X direction between the contact plugs 8 on the protruding portion 2a of the active regions 2 adjacent to each other. In the present embodiment, the protruding portions 2a of the active regions 2 adjacent to each other are arranged in the X direction or in the Y direction. The same applies to the protruding portions 2b of the active regions 2 adjacent to each other, the protruding portions 2c of the active regions 2 adjacent to each other, the protruding portions 2d of the active regions 2 adjacent to each other, and the central portions 2e of the active regions 2 adjacent to each other. Such an arrangement of the active region 2 can be achieved by inclining the X' direction with respect to the X direction by a predetermined angle and inclining the Y' direction with respect to the Y direction by a predetermined angle. The method of calculating the predetermined angle will be described later with reference to FIG. 6.

Figure 6:
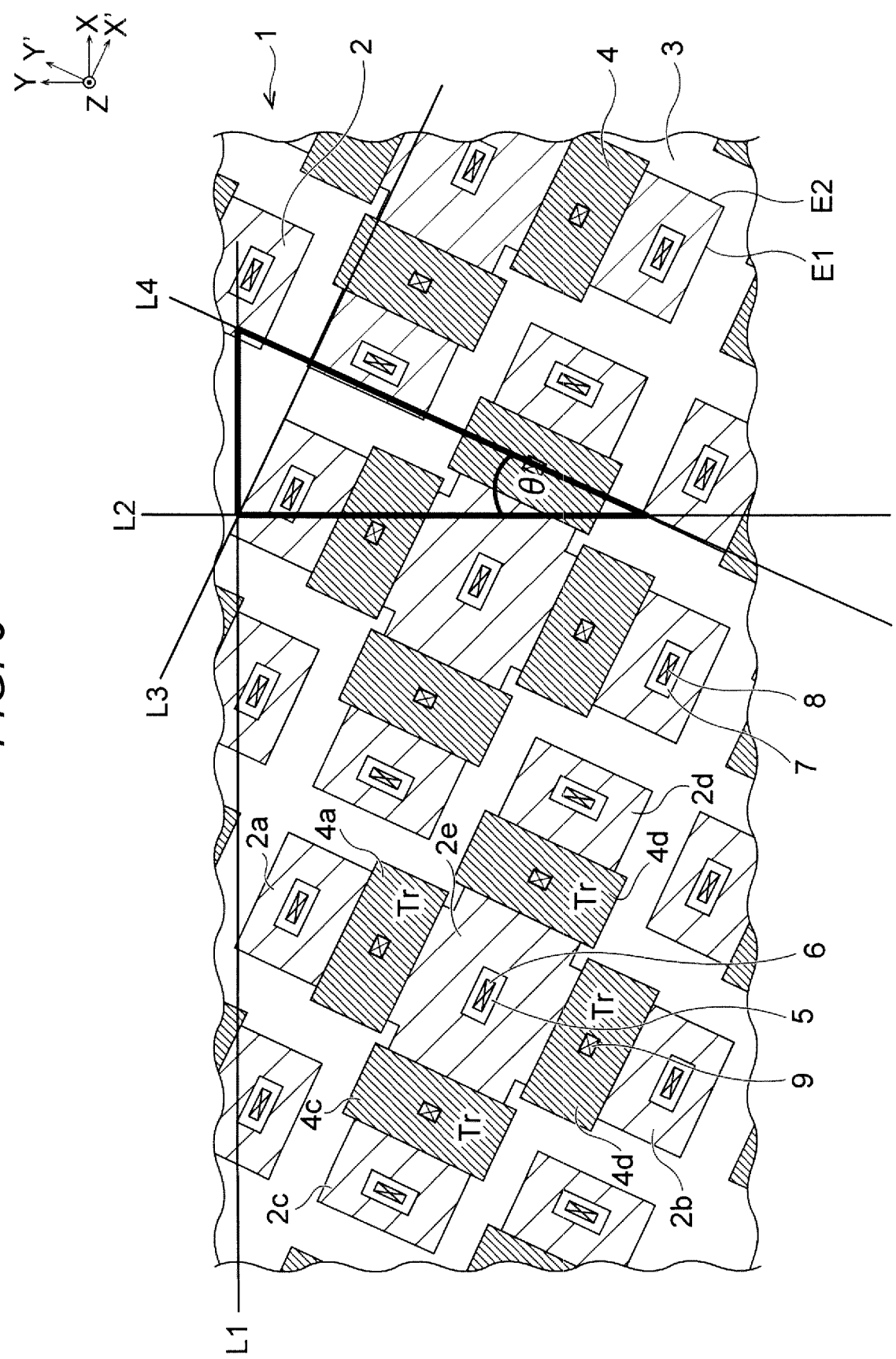
FIG. 6 is a plan view illustrating details of the structure of the semiconductor device in the second embodiment.

FIG. 6 is a plan view illustrating the details of the structure of the semiconductor device in the second embodiment.

FIG. 6 is an enlarged plan view of FIG. 5, and illustrates a straight line L1 extending in the X direction, a straight line L2 extending in the Y direction, a straight line L3 extending in the X' direction, and a straight line L4 extending in the Y' direction. FIG. 6 further illustrates a right triangle formed by the straight lines L1, L2, and L4 by a thick line. FIG. 6 further illustrates an angle θ between the straight line L2 and the straight line L4. The angle θ represents the inclination of the X' direction with respect to the X direction and the inclination of the Y' direction with respect to the Y direction. The angle θ can be calculated by setting a length of the hypotenuse of the right triangle to the pitch in the Y' direction between the protruding portions 2a, setting a length of the long side of the right triangle to the pitch (S1) in the Y direction between the protruding portions 2a, and then, by calculating an inverse function of cosine for the ratio R of these pitches ($\theta = \cos^{-1} R$).

According to the present embodiment, by arranging the central portions 2e of the active regions 2 adjacent to each other in the Y direction, it is possible to appropriately arrange the wiring for connecting the contact plugs 6 on the central portion 2e to each other. Hereinafter, details of such arrangement will be described with reference to FIG. 7 to FIG. 9. Specifically, after explaining the wiring structure of the semiconductor device in the first embodiment with reference to FIG. 7, the wiring structure of the semiconductor device in the present embodiment (second embodiment) will be described with reference to FIG. 8.

Figure 7:
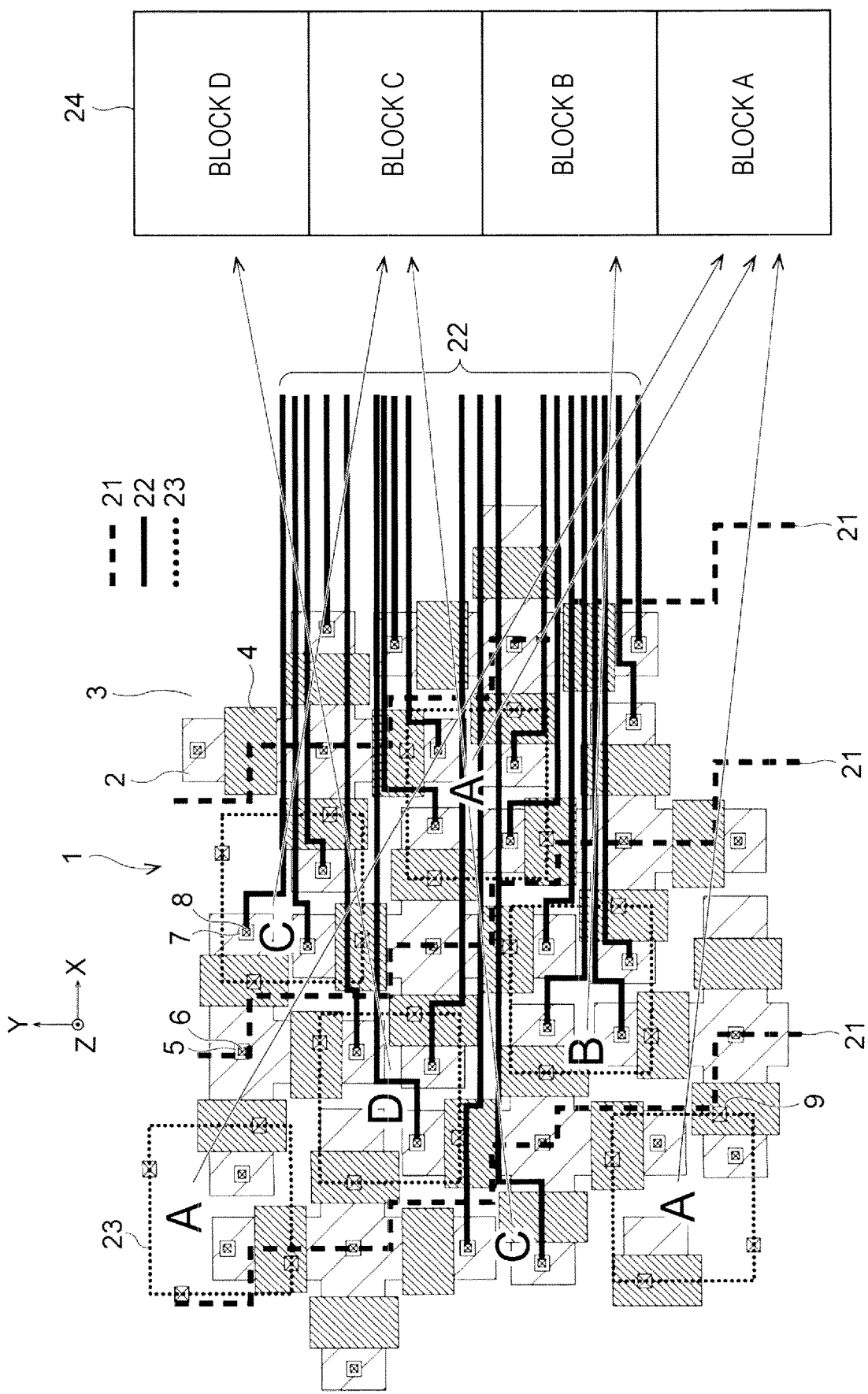
FIG. 7 is a plan view illustrating an example of a wiring structure of the semiconductor device in the first embodiment.

FIG. 7 is a plan view illustrating an example of the wiring structure of the semiconductor device in the first embodiment.

As illustrated in FIG. 7, the semiconductor device in the first embodiment includes a plurality of wirings 21, a plurality of wirings 22, and a plurality of wirings 23. The wiring 21 and the wiring 23 are illustrated by dashed lines and dotted lines respectively to distinguish them from the wiring 22 illustrated by the solid line, but are not disconnected in a shape of dashed line or in a shape of dotted line, but extend in a shape of solid line. FIG. 7 further schematically illustrates the memory cell array 24 in the semiconductor device in the first embodiment. FIG. 7 further illustrates blocks A to D of the protruding portions 2a to 2d and blocks A to D in the memory cell array 24.

Each wiring 21 electrically connects the central portions 2e of a plurality of active regions 2 to each other, and specifically, is formed on the contact plug 6 on these central portions 2e. The wiring 21 in the first embodiment generally extends in a shape of polygonal line in the Y direction. The contact plug 6 is an example of the first plug, and the wiring 21 is an example of a first wiring.

Each wiring 22 electrically connects any of the protruding portions 2a to 2d of one active region 2 and the memory cell array 24 to each other. Specifically, each wiring 22 is formed on the contact plug 8 on the protruding portion 2a, the protruding portion 2b, the protruding portion 2c, or the protruding portion 2d, and extends from the contact plug 8 to the memory cell array 24 in line shape. The memory cell array 24 includes the blocks A to D, and includes a plurality of cell transistors (memory cells) and a plurality of select transistors in each block A to D. The contact plug 8 is an example of a second plug, and the wiring 22 is an example of a second wiring.

Each wiring 22 in the first embodiment electrically connects the contact plug 8 in a certain block and the same block in the memory cell array 24 to each other. For example, a certain wiring 22 in the first embodiment electrically connects the contact plug 8 in the block A and the block A in the memory cell array 24 to each other. In this way, the peripheral transistor Tr in the block A can control the operation of the block A in the memory cell array 24. This is also applied to the blocks other than the block A.

Each wiring 23 is formed on a plurality of contact plugs 9. These contact plugs 9 are formed on different gate electrodes 4. In this way, the different gate electrodes 4 are electrically connected to each other. The wiring 23 in the first embodiment has an annular shape extending in the X direction and the Y direction. The contact plug 9 is an example of a third plug, and the wiring 23 is an example of a third wiring.

Each wiring 23 in the first embodiment is formed on the protruding portions 2a to 2d that form one block, and electrically connects the contact plugs 9 on the protruding portions 2a to 2d to each other. For example, a certain wiring 23 in the first embodiment electrically connects the four contact plugs 9 of the block A to each other. In this way, the peripheral transistor Tr can be operated for each block. This is also applied to the blocks other than the block A.

Figure 8:
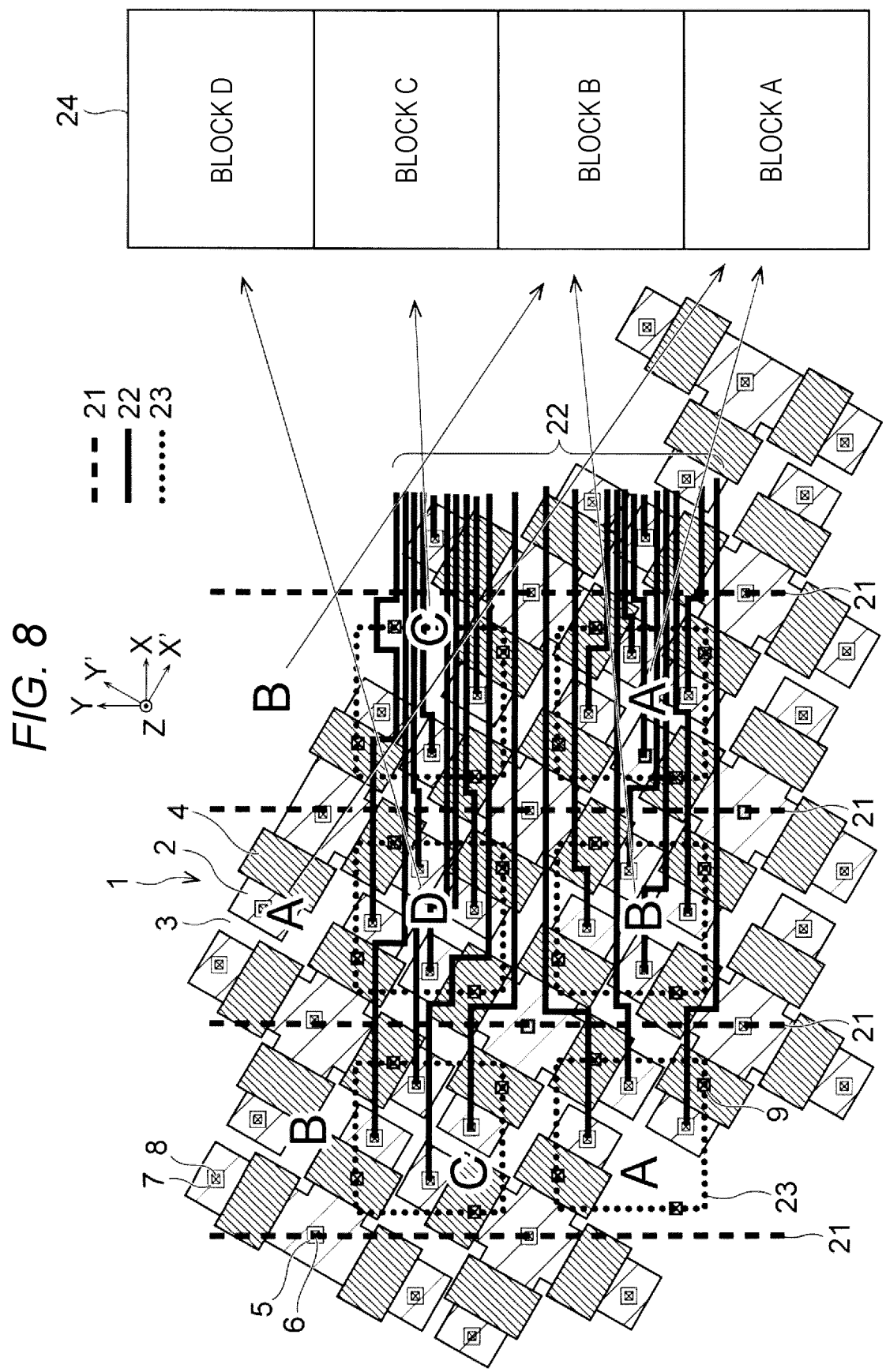
FIG. 8 is a plan view illustrating an example of a wiring structure of the semiconductor device in the second embodiment.
Figure 9A:
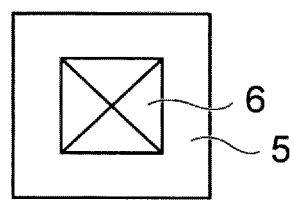
FIG. 9A to FIG. 9D are plan views illustrating an example of a shape of a diffusion region of the semiconductor device in the second embodiment.
Figure 9B:
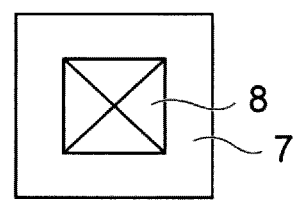
Figure 9C:
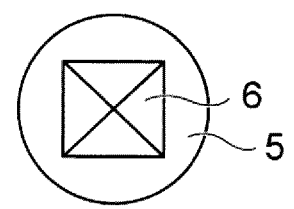
Figure 9D:
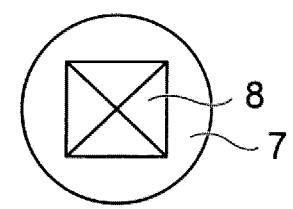

FIG. 8 is a plan view illustrating an example of the wiring structure of the semiconductor device in the second embodiment.

Similarly to the semiconductor device in the first embodiment, the semiconductor device in the present embodiment includes a plurality of wirings 21, a plurality of wirings 22, a plurality of wirings 23, a plurality of contact plugs 9, and the memory cell array 24. FIG. 8 further illustrates the blocks A to D of the protruding portions 2a to 2d and the blocks A to D in the memory cell array 24.

The wiring 21 (FIG. 7) of the first embodiment generally extends in a shape of polygonal line in the Y direction, whereas the wiring 21 (FIG. 8) in the present embodiment extends in a shape of straight line in the Y direction. In the present embodiment, since the central portions 2e of the active region 2 are arranged in the Y direction, the wiring 21 can be extended in the Y direction. As a result, for example, it becomes easy to arranging elements other than the wiring 21 and the contact plug 6 above the substrate 1 while avoiding the wiring 21 and the contact plug 6.

FIG. 9 is a plan view illustrating an example of the shape of the diffusion regions 5 and 7 in the semiconductor device in the second embodiment.

As illustrated in FIG. 9A to FIG. 9D, the semiconductor device in the present embodiment (FIG. 8) includes the diffusion regions 5 and 7 having a planar shape of a square or a circular shape, and contact plugs 6 and 8 formed on these diffusion regions 5 and 7. The above-described square may be a strict square or a square different from the strict square, such as a square with rounded corners. This is also applied to the above-described circular shape. For example, the optical influence when transferring the pattern shape of the photomask to the resist film, a case where the square of the photomask is transferred as a circular shape resist film is considered. Such a change from the square to the circular shape can also occur, for example, by diffusion of the impurity atoms injected into the active region 2 in order for forming the diffusion regions 5 and 7.

If the planar shape of the diffusion regions 5 and 7 in the present embodiment is rectangular or oval shape, when the diffusion regions 5 and 7 are not inclined according to the inclination of the active region 2, the diffusion regions 5 and 7 and the contact plugs 6 and 8 become an obstacle to arrange other elements. However, if the diffusion regions 5 and 7 are also inclined according to the inclination of the active region 2, the process of forming the diffusion regions 5 and 7 becomes troublesome.

Therefore, in the present embodiment, the planar shapes of the diffusion regions 5 and 7 are set to be square or circular shape. If the planar shape of the diffusion regions 5 and 7 is square, even when the diffusion regions 5 and 7 are not inclined according to the inclination of the active region 2, the diffusion regions 5 and 7 and the contact plugs 6 and 8 are less likely to become an obstacle to arrange other elements. If the planar shape of the diffusion regions 5 and 7 is a circular shape, since the planar shape of the diffusion regions 5 and 7 is rotationally symmetric, it is not necessary to incline the diffusion regions 5 and 7 according to the inclination of the active region 2. As a result, even if the diffusion regions 5 and 7 are not inclined according to the inclination of the active region 2, it is possible to avoid the process of forming the diffusion regions 5 and 7 from becoming troublesome.

In FIG. 8, the shapes of the diffusion regions 5 and 7 are set to be circular shapes. In addition, the contact plugs 6 and 8 are arranged on the diffusion regions 5 and 7 according to the inclination of the active region 2 without inclining the contact plugs 6 and 8. According to the present embodiment, by setting the planar shape of the diffusion regions 5 and 7 to be square or circular shape, it becomes easy to form the diffusion regions 5 and 7 and the contact plugs 6 and 8 while suppressing the diffusion regions 5 and 7 and the contact plugs 6 and 8 from becoming the obstacle to arrange other elements.

Even though the shapes of the diffusion regions 5 and 7 are set to be circular shape in FIG. 7, the shapes of the diffusion regions 5 and 7 in the first embodiment may be other than square and circular shapes, and may be, for example, rectangular or oval shape.

As described above, the active region 2 in the present embodiment is inclined with respect to the four sides of the upper surface of the substrate 1. Therefore, according to the present embodiment, it becomes possible to arrange the central portions 2e of the different active regions 2 in the X direction and the Y direction, and thus, it possible to preferably arrange the wiring 21 that connects the contact plugs 6 on the central portion 2e.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
    a substrate; and
    a plurality of active regions provided in the substrate, the plurality of active regions including a first active region, second active region, third active region, and fourth active region, wherein each of the first, second, third, and fourth active regions includes
        a central portion,
        first and second portions provided at opposite sides of the central portion in a first direction, and
    third and fourth portions provided at opposite sides of the central portion in a second direction orthogonal to the first direction,
        wherein an end portion of the first portion of the first active region faces a side portion of the fourth portion of the fourth active region,
        an end portion of the second portion of the second active region faces a side portion of the third portion of the third active region,
        an end portion of the third portion of the third active region faces a side portion of the first portion of the first active region, and
        an end portion of the fourth portion of the fourth active region faces a side portion of the second portion of the second active region.

2. The semiconductor device according to claim 1, wherein a first distance between the first portion of the first active region and the fourth portion of the fourth active region, a second distance between the second portion of the second active region and the third portion of the third active region, a third distance between the third portion of the third active region and the first portion of the first active region, and a fourth distance between the fourth portion of the fourth active region and the second portion of the second active region, are all equal to each other.

3. The semiconductor device according to claim 1, wherein a first distance between the first portion of the first active region and the fourth portion of the fourth active region is shorter than a width of the first portion, a second distance between the second portion of the second active region and the third portion of the third active region is shorter than a width of the second portion, a third distance between the third portion of the third active region and the first portion of the first active region is shorter than a width of the third portion, and a fourth distance between the fourth portion of the fourth active region and the second portion of the second active region is shorter than a width of the fourth portion.

4. The semiconductor device according to claim 1, wherein a planar shape of each of the first, second, third, and fourth active regions is a cross shape in which the first, second, third, and fourth portions are provided around the central portion.

5. The semiconductor device according to claim 1, wherein an upper surface of the substrate has a first side and a second side, the first direction is parallel to the first side, and the second direction is parallel to the second side.

6. The semiconductor device according to claim 1, wherein an upper surface of the substrate has the first side and a second side, and the first direction is inclined with respect to the first side, and the second direction is inclined with respect to the second side.

7. The semiconductor device according to claim 1, further comprising:

a first diffusion region provided in the central portion; and
a first plug provided on the first diffusion region,
wherein a planar shape of the first diffusion region is a square or circular shape.

8. The semiconductor device according to claim 1, further comprising:

a second diffusion region provided in the first, second, third, or fourth portion; and a second plug provided on the second diffusion region,
wherein a planar shape of the second diffusion region is a square or circular shape.

9. The semiconductor device according to claim 1, further comprising:

first, second, third, and fourth transistors, each including a gate insulating film and a gate electrode, provided on the first, second, third, and fourth portions, respectively.

10. The semiconductor device according to claim 9, wherein the first, second, third, and fourth transistors are control transistors configured to control a memory cell array.

11. The semiconductor device according to claim 9, further comprising:

a first plug provided on the central portion;
a second plug provided on the first, second, third, or fourth portion;
a third plug provided on the gate electrode;
a first wiring provided on the first plug;
a second wiring that electrically connects the second plug and the memory cell array; and
a third wiring provided on the third plug.

12. The semiconductor device according to claim 11, wherein the first wiring has a straight line shape.

13. The semiconductor device according to claim 11, wherein the third wiring has an annular shape.

14. The semiconductor device according to claim 1, further comprising:

an element isolation area provided in the substrate.

15. The semiconductor device according to claim 1, wherein the second portion is provided at an opposite side of the first portion from the central portion in the first direction, and the fourth portion is provided at an opposite side of the third portion from the central portion in the second direction.

* * * * *